US006947567B1

(12) United States Patent
Gagon

(10) Patent No.: US 6,947,567 B1
(45) Date of Patent: Sep. 20, 2005

(54) AUDIO BOOST CIRCUIT

(75) Inventor: Paul R. Gagon, Huntington Beach, CA (US)

(73) Assignee: BBE Sound Inc., Huntington Beach, CA (US)

( * ) Notice: Subject to any disclaimer, the term of this patent is extended or adjusted under 35 U.S.C. 154(b) by 0 days.

(21) Appl. No.: 09/444,541

(22) Filed: Nov. 22, 1999

Related U.S. Application Data

(63) Continuation-in-part of application No. 09/439,119, filed on Nov. 12, 1999, now abandoned.

(51) Int. Cl.[7] .............................................. H03G 5/00
(52) U.S. Cl. ....................................... 381/98; 330/128
(58) Field of Search .......................... 381/98, 106, 103; 330/128; 333/28 T, 28 R

(56) References Cited

U.S. PATENT DOCUMENTS

| | | | |
|---|---|---|---|
| 4,327,331 A | 4/1982 | Yoshimi et al. .............. | 330/149 |
| 4,482,866 A | 11/1984 | Crooks ........................ | 330/149 |
| 4,638,258 A | 1/1987 | Crooks ........................ | 330/149 |
| 4,891,841 A * | 1/1990 | Bohn ........................... | 381/98 |
| 5,510,752 A | 4/1996 | Gagon ......................... | 330/126 |
| 5,574,791 A | 11/1996 | Orban .......................... | 381/98 |
| 5,736,897 A | 4/1998 | Gagon ......................... | 330/126 |
| 5,828,755 A | 10/1998 | Feremans et al. ............. | 381/61 |

OTHER PUBLICATIONS

"Handbook of Operational Amplifiers Active RC Netowrks", 1966 at pp. 32-34 and 78-79 published by the Burr-Brown Research Corporation, International Airport Industrial Park, Tucson, Arizona 85706.
"The Active Filter Handbook" by Frank Tedeschi, pp. 160-168, Tab Books Inc. of Blue Ridge Summit, PA, 17214.

* cited by examiner

Primary Examiner—Ping Lee
(74) Attorney, Agent, or Firm—James F. Kirk

(57) ABSTRACT

An audio boost circuit having an input buffer responsive to a program input signal for providing a buffered program signal, An all pass phase inverter having an input coupled to receive the buffered program signal and an output providing an inverted buffered program signal. A band pass filter having a predetermined Q, responsive to the buffered program signal for providing an inverted band pass boosted program signal. A summing amplifier for adding the inverted buffered program signal to the inverted band pass boosted program signal and for providing a composite program signal signal. A frequency adjustment means for adjusting the frequency at which the peak gain occurs. The input buffer is a state-variable input filter that processes the program input signal into high, low and mid-range frequency signal components. The input buffer has gain control circuitry for balancing and summing the high and mid-range signal components. A state-variable band-pass active filter processes the program input signal to produce the high, low and mid-range frequency signal components. A summing circuit adds the high, low and mid-range frequency signal components to provide the buffered program signal.

16 Claims, 4 Drawing Sheets

AUDIO BOOST CIRCUIT

This patent application is a continuation-in-part application of parent application having Ser. No. 09/439,119 filed Nov. 12, 1999, now abandoned, for an Audio Boost Circuit having a common inventor and assignee.

BACKGROUND OF THE INVENTION

1. Field of the Invention

This invention relates to the field of electronics amplifiers and more particularly to the field of signal conditioning circuits for signal boosting within a predetermined bandwidth so as to compensate for reduced speaker performance resulting from reduced woofer size.

2. Description of Related Art

U.S. Pat. No. 5,736,897 for a Low Input Signal Bandwidth Compressor & Amplifier Control Circuit with a State-variable Pre-Amplifier issued on Apr. 7, 1998 to Paul Gagon who assigned the invention to BBE Sound of Huntington Beach, Calif. The contents of U.S. Pat. No. 5,736,897 are incorporated by reference herein in its entirety. The inventor and assignee are common with those for the present invention. The '897' patent shows the use of a state-variable filter. The '897' reference does not show or teach the use of an Infinite Gain Multiple Feedback Band-Pass Filter in combination with a State-Variable Band-Pass Filter acting as a pre-amplifier.

SUMMARY OF INVENTION

In a first embodiment, the invention audio boost circuit has an input buffer responsive to a program input signal having high, low and mid-range frequency signal components for providing a buffered program signal. The buffered program signal is fed to an all pass phase inverter having an input coupled to receive the buffered program signal and an output providing an inverted buffered program signal. The buffered program signal is also fed to a Band-pass filter having a predetermined Q, responsive to the buffered program signal for providing an inverted Band-pass boosted program signal. A summing amplifier adds the inverted buffered program signal to the inverted Band-pass boosted program signal to provide a composite program signal as an output signal to a power amplifier and speaker combination. In a more particular embodiment, the Band-pass filter has a peak gain at a center frequency, and a frequency adjustment means is provided for adjusting the frequency at which the peak gain occurs. In a more particular embodiment, the Band-pass filter has a first second and third resistor and a first and second capacitor. The Band-pass filter's first, second and third resistor values and the values of the first and second capacitors are selected to obtain a Q in the range of from 3 to 6. A frequency adjustment resistor in series with the second resistor is adjusted to position the peak gain of the Band-pass filter at a frequency in the range of 50 to 100 cycles/sec.

A second alternative embodiment of the invention audio boost circuit comprises an input buffer responsive to a program input signal having high, low and mid-range frequency signal components for providing a buffered program signal, the input buffer comprises: a state-variable filter for processing the input program signal into high, low and mid-range frequency compensated signal components. The state-variable filter comprises: a first amplifier stage responsive to the program signal that provides a high frequency compensated signal; a second amplifier stage responsive to an output of the first amplifier stage that provides a mid-range compensated signal; and, a third amplifier stage responsive to an output of the second amplifier stage that provides a low range compensated signal.

The input buffer further comprises: a state-variable summing amplifier for adding the high frequency compensated signal, the low frequency compensated signal and the mid-range compensated signal and an adjusting means for adjusting the gain between the high frequency compensated signal and the mid-range compensated signal; and the low frequency compensated signal to provide the buffered program signal.

The input buffer is followed by an all pass phase inverter having an input coupled to receive the buffered program signal and an output that provides an inverted buffered program signal. A Band-pass filter with a predetermined Q, is coupled to the buffered program signal to provide an inverted Band-pass boosted program signal. A summing amplifier adds the inverted buffered program signal to the inverted Band-pass boosted program signal to provide a composite program signal. A power amplifier and speaker respond to the composite program signal to produce an audible sound in response to the composite program signal.

In a more particular second embodiment of the state-variable filter, the mid-range signal components are inverted in phase with respect to the high and low frequency signal components. The state-variable filter further comprises: a first amplifier stage having an inverting and non-inverting input. The program signal is coupled to the inverting input; and, a resistor divider network is coupled to the mid-range compensated signal. The resistor divider network has an output that provides a portion of the mid-range compensated signal to the first amplifier non-inverting input.

PREFERRED EMBODIMENT

Figure 1:
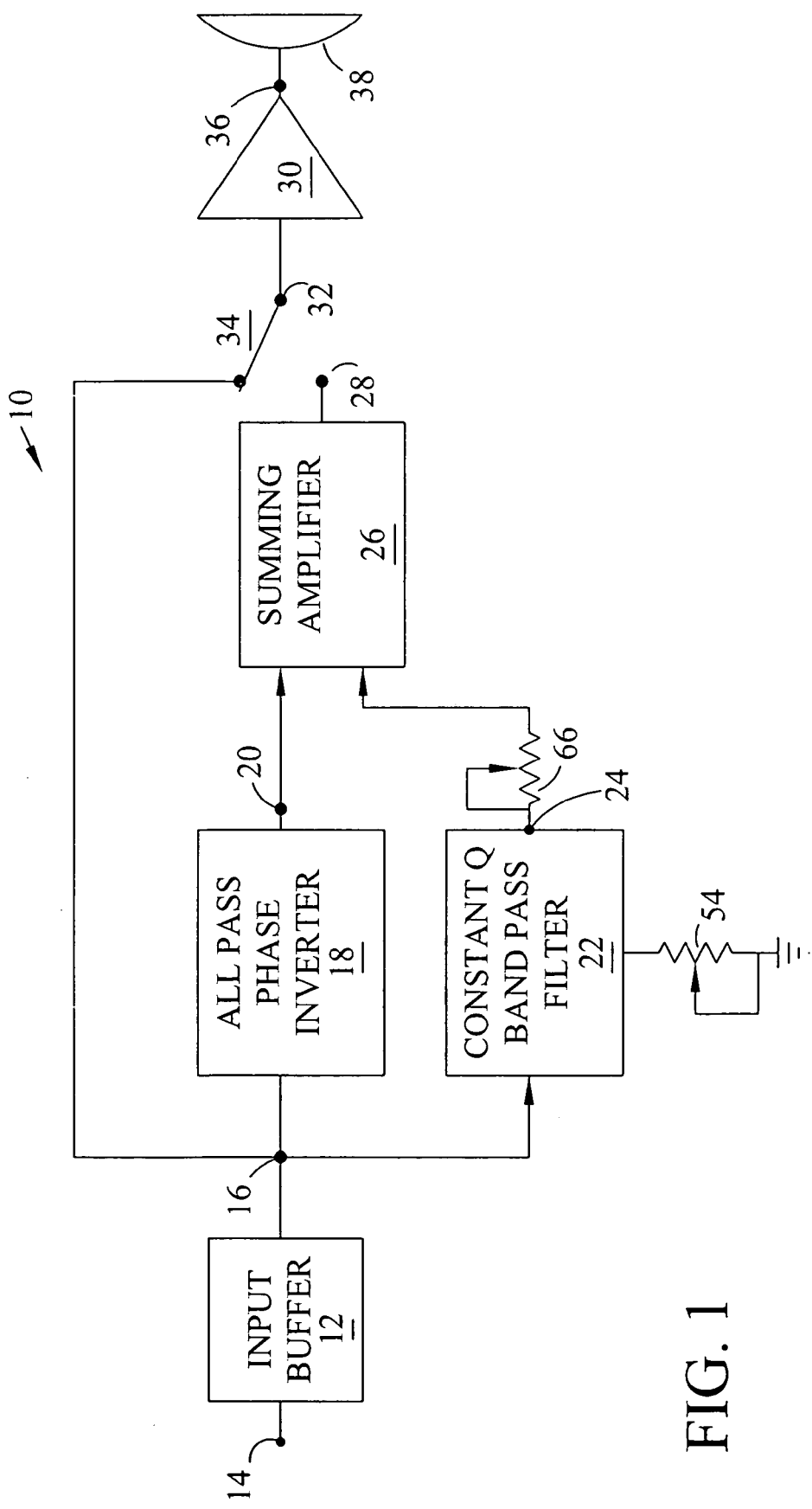
FIG. 1. is a block diagram of the audio boost circuit.

FIG. 1. is a block diagram of the audio boost circuit 10 showing an input buffer 12 having an input 14 and an output at terminal 16. An all pass phase inverter 18 has its input connected to terminal 16 and its output is connected to terminal 20. A constant Q band pass filter 22 has its input connected to terminal 16 and its output connected to terminal 24. Summing amplifier 26 has a first input connected to terminal 20, a second input connected to terminal 24 and an output connected to terminal 28. Block 30 represents a power amplifier having an input connected to the transfer contact 32 of switch 34. The power amplifier output 36 is shown connected to a speaker 38.

The input buffer 12 is coupled to receive a program input signal at input terminal 14. The program input signal is typically received from a tape player or a CD reader. Such signals typically contain audio information such as recorded music, and have amplitudes in the range of 0–150 mV RMS. The program input signal typically has high, low and mid-range frequency audio signal components that are processed by the input buffer 12 to provide a buffered program signal at terminal 16.

The Band-pass filter 22 is designed to have a predetermined Q with a center frequency that is empirically selected to optimize the performance of the power amplifier 30 and speaker 38. The Band-pass filter 22 amplifies and phase invert a narrow range of low frequency of the buffered program signal and provides an inverted Band-pass boosted program signal to terminal 24.

Summing amplifier 26 adds the inverted buffered program signal received at its first input from terminal 20 to the inverted band pass boosted program signal received at its second input from terminal 24 and outputs the sum of the signals as a composite program signal signal at terminal 28.

Figure 2:
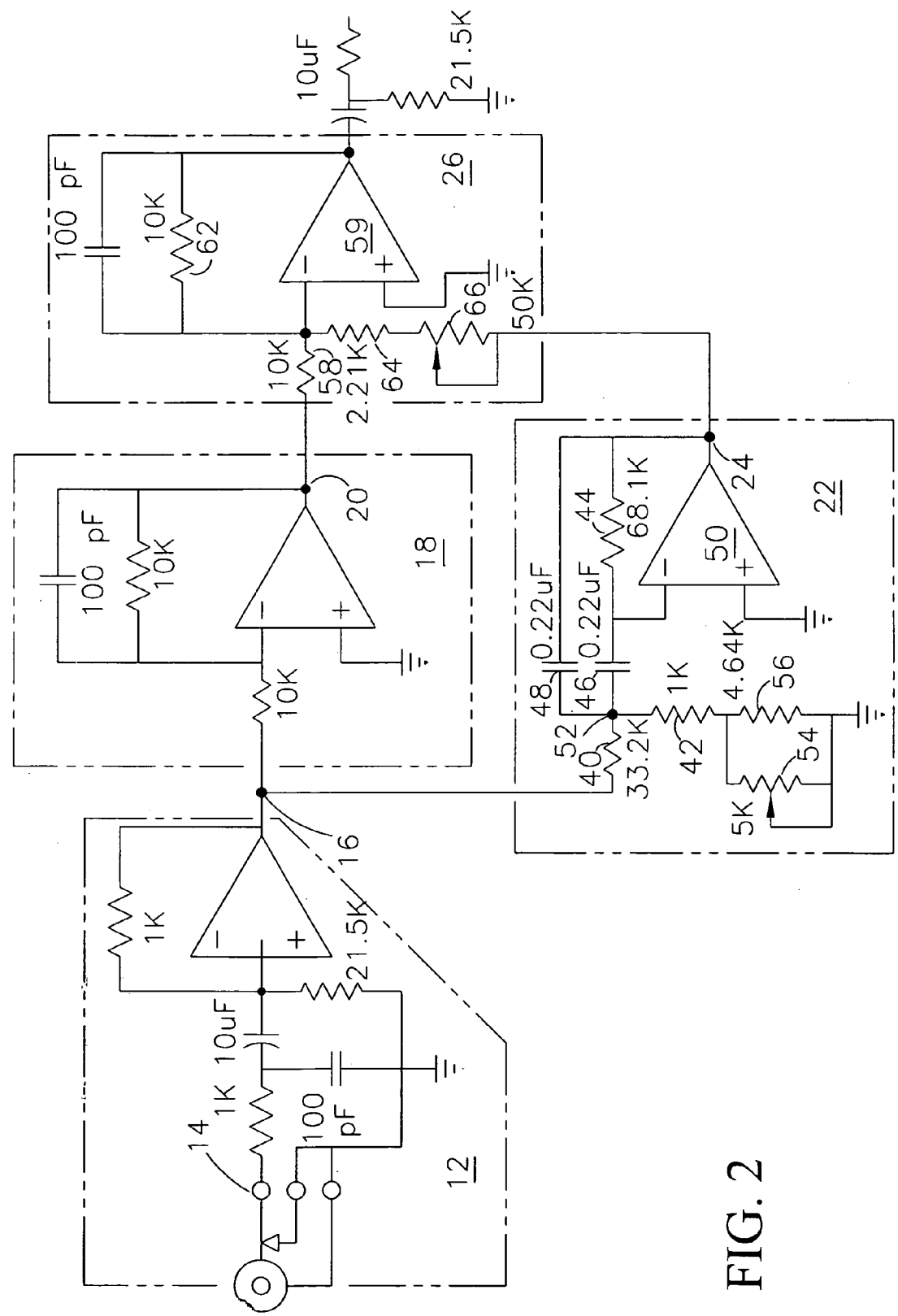
FIG. 2 is a schematic of the block diagram of FIG. 1 showing a first embodiment of an input buffer, the all pass phase inverter, the constant Q band pass filter and the summing amplifier.

FIG. 2 is a schematic of a first embodiment of the audio boost circuit. The component values shown were used in a circuit that was built and tested. Phantom block 12 shows the input buffer comprising a simple unity gain non-inverting amplifier. An inverting unity gain amplifier would work equally as well. The amplifier shown is typically ¼ of a TL072. The 10 uF capacitor is a dc blocking capacitor. The 100 pF capacitor provides high frequency noise suppression. A second embodiment of the input buffer using a state-variable filter is discussed later in connection with FIGS. 3 and 4.

The all pass phase inverter within phantom block 18 is an inverting unity gain amplifier. The 100 pF capacitor is used to enhance the stability of the operational amplifier. The Band-pass filter within phantom block 22 is designed to have a predetermined Q in the range of from 3 to 6. The Q selected and the center frequency selected are empirically determined with the power amplifier and speaker combination for best results. The Band-pass filter has first second and third resistors 40, 42 and 44, each resistor having a first and second terminal. The Band-pass filter also has a first and second capacitor 46 and 48, each capacitor having a first and second terminal. Operational amplifier 50 has an inverting input, a non-inverting input and an output connected to terminal 24. The non-inverting input is connected to a reference potential such as ground.

The first resistor 40 first terminal is coupled to terminal 16 to receive the buffered program signal. The first resistor second terminal is coupled or connected to node 52. The second resistor 42 first terminal and the first terminal of the first and second capacitors 46, 48 are also connected to node 52.

The second resistor 42 second terminal is connected to the first terminal of resistor 56. In the embodiment of FIG. 2, adjustable resistor 54 is connected in parallel with resistor 56, the pair being in series with resistor 42 to form a frequency adjustment means for adjusting the frequency at which the peak gain of the Band-pass filter 22 occurs. The adjustment means could be a single equivalent value resistor selected to replace the second resistor 42 in series with the parallel combination of the adjustable resistor 54 and resistor 56.

The first capacitor 46 second terminal is connected to the inverting input of operational amplifier 50 and to the third resistor's 44 first terminal. The second terminal of capacitor 48 is connected to the output terminal 24 of operational amplifier 50 and to the second terminal of the third resistor 44.

The band pass filter of phantom block 22 is referred to as an infinite gain multiple feedback band pass filter. The design of an infinite gain multiple feedback band pass filter such as shown in phantom block 22 in FIG. 2 is taught with examples given in the text "The Active Filter Handbook" by Frank P. Tedeschi, pg 160–168, Tab Books Inc of Blue Ridge Summit, Pa., 17214.

An alternative discussion with design examples is found in the "Handbook Of Operational Amplifiers Active RC Networks" 1966, at pages 32–34 and 78–79, published by the BURR-BROWN RESEARCH, CORPORATION, INTERNATIONAL AIRPORT INDUSTRIAL PARK, TUCSON, Ariz. 85706.

However, the topology for a set of design requirements is not unique nor are the values for a given topology. The following example and equations show how the component values are determined for a circuit in which the Q, center frequency f and the peak gain Ao are given. In general, the Q of a band-pass filter is defined as the bandwidth divided by the center frequency. Assume that the center frequency required is 78.8 Hz. Assume that the Q required is 5.4 and the peak gain Ao required is 1.03. The first and second capacitors have the same value which is defined as c. A convenient value of 0.39 uF is selected for a first try. Using the design procedure found in the "Handbook Of Operational Amplifiers Active RC Networks" mentioned above:

$$c \equiv 0.39 \cdot 10^{-6} \quad Q \equiv 5.4 \quad f \equiv 78.7 \quad Ao \equiv 1.03$$

$$a := \frac{1}{Q} \quad\quad k \equiv 2 \cdot \pi \cdot f \cdot c \quad\quad \pi \equiv 3.14159$$

$$a = 0.185 \quad\quad k = 1.928 \cdot 10^{-4} \quad\quad H := \frac{Ao}{Q}$$

$$R1 := \frac{1}{H \cdot k} \quad\quad R2 := \frac{1}{(2 \cdot Q - H) \cdot k} \quad R3 := 2 \cdot \frac{Q}{k}$$

$$R1 = 2.719 \cdot 10^4 \quad\quad R2 = 488.76 \quad\quad R3 = 5.6 \cdot 10^4$$

With a Q of 3 specified, the following values of resistors were calculated using the same value of capacitors:

$$R1 = 1.51 \cdot 10^4 \quad R2 = 916.686 \quad R3 = 3.111 \cdot 10^4$$

The values of R1, R2 and R3 correspond to the values of the first, second and third resistors in the previous example. It can be seen that the values of resistors are obtainable for the range of Q of 3 to 6 that is desired. The frequency adjustment resistor 54 and the values of resistors 42 and 56 which combine to form R2 in the calculations above are calculated or determined empirically to position the peak gain at a frequency in the range of 50 to 100 hertz.

The summing amplifier within phantom block 26 represents a means for adding the inverted buffered program signal to the inverted Band-pass boosted program signal and for providing a composite program signal. Resistor 58 has a first and second terminal. The first terminal of resistor 58 is connected to terminal 20 to receive the inverted buffered program signal. The second terminal of resistor 58 is connected to the inverting input of operational amplifier 59 and to the first terminal of the feed-back resistor 62. The second terminal of the feedback resistor 62 is connected to the output of the summing amplifier terminal 26.

Resistor 64 and 66 in series have a first and second terminal. The first terminal of the series combination is connected to terminal 20 to receive the inverted buffered program signal. The first terminal of the series combination is also connected to the inverting input of operational amplifier and to the first terminal of the feed-back resistor 62. The second terminal of the series combination is connected terminal 24 to receive the inverted band pass boosted program signal from the band pass filter.

Adjustable resistor 66 in series with resistor 64 represent a boost adjusting resistor in series with the second input to the summing amplifier for adjusting the relative gain of the inverted buffered program signal with respect to the inverted band pass boosted program signal.

Figure 3:
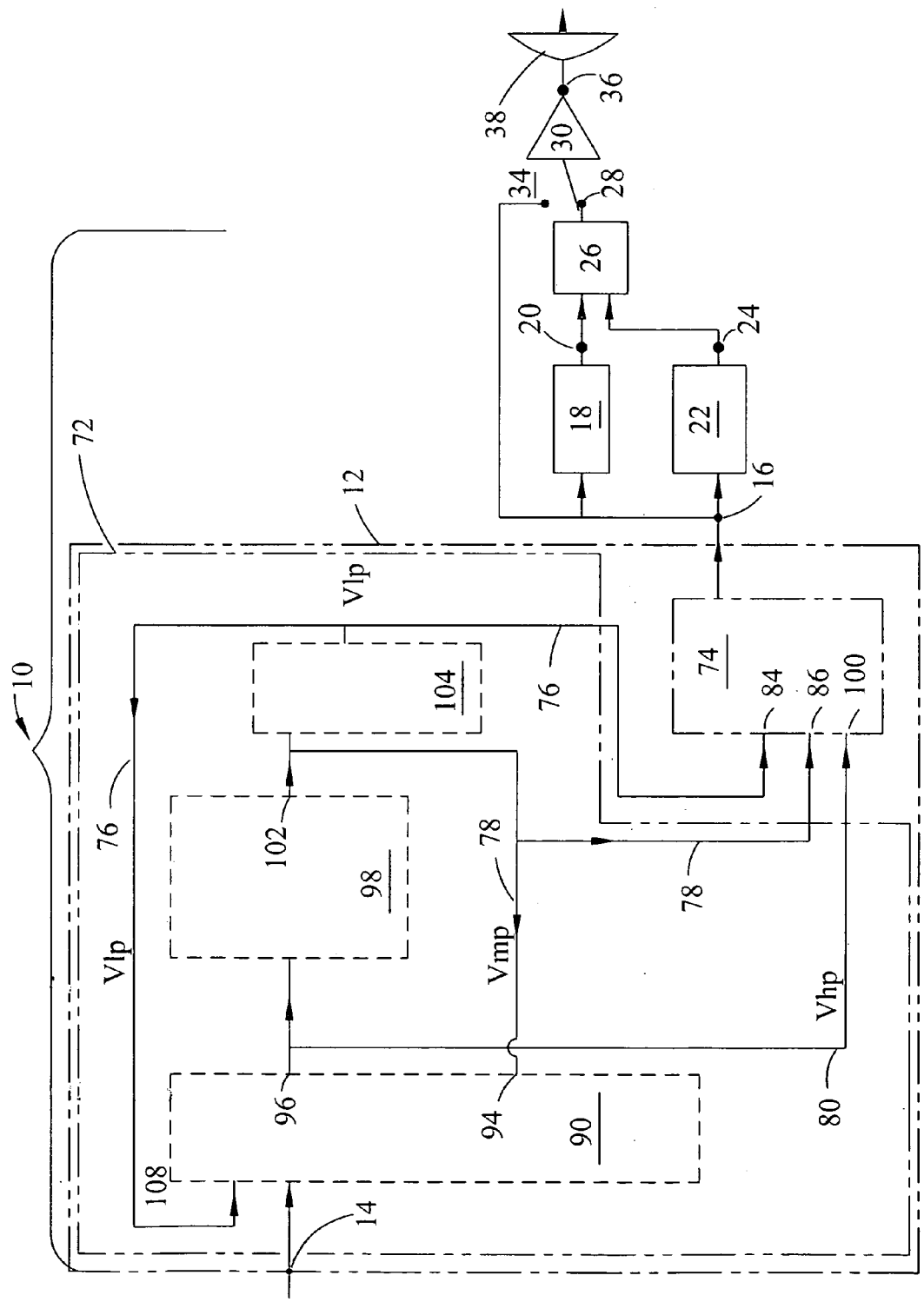
FIG. 3 is an expanded block diagram of FIG. 1 showing a second embodiment of the input buffer.

FIG. 3 is shows the block diagram of a second alternative embodiment of the input buffer 12 using a state-variable filter 72 responsive to the program input signal at terminal 14 for separating and processing the high, low and mid-range frequency signal components of the program signal. This second embodiment of the input buffer 12 has a state-variable summing amplifier 74 for adding the high, low and mid-range frequency signal components to provide the buffered program signal at terminal 16.

The state-variable filter 72 has a first amplifier stage 90 responsive to the program signal for providing a high frequency compensated signal Vhp; a second amplifier stage 98 responsive to an output of the first amplifier stage for providing a mid-range compensated signal Vmp; and a third amplifier stage 104 responsive to the mid range compensated signal for providing a low range compensated signal Vlp.

Figure 4:
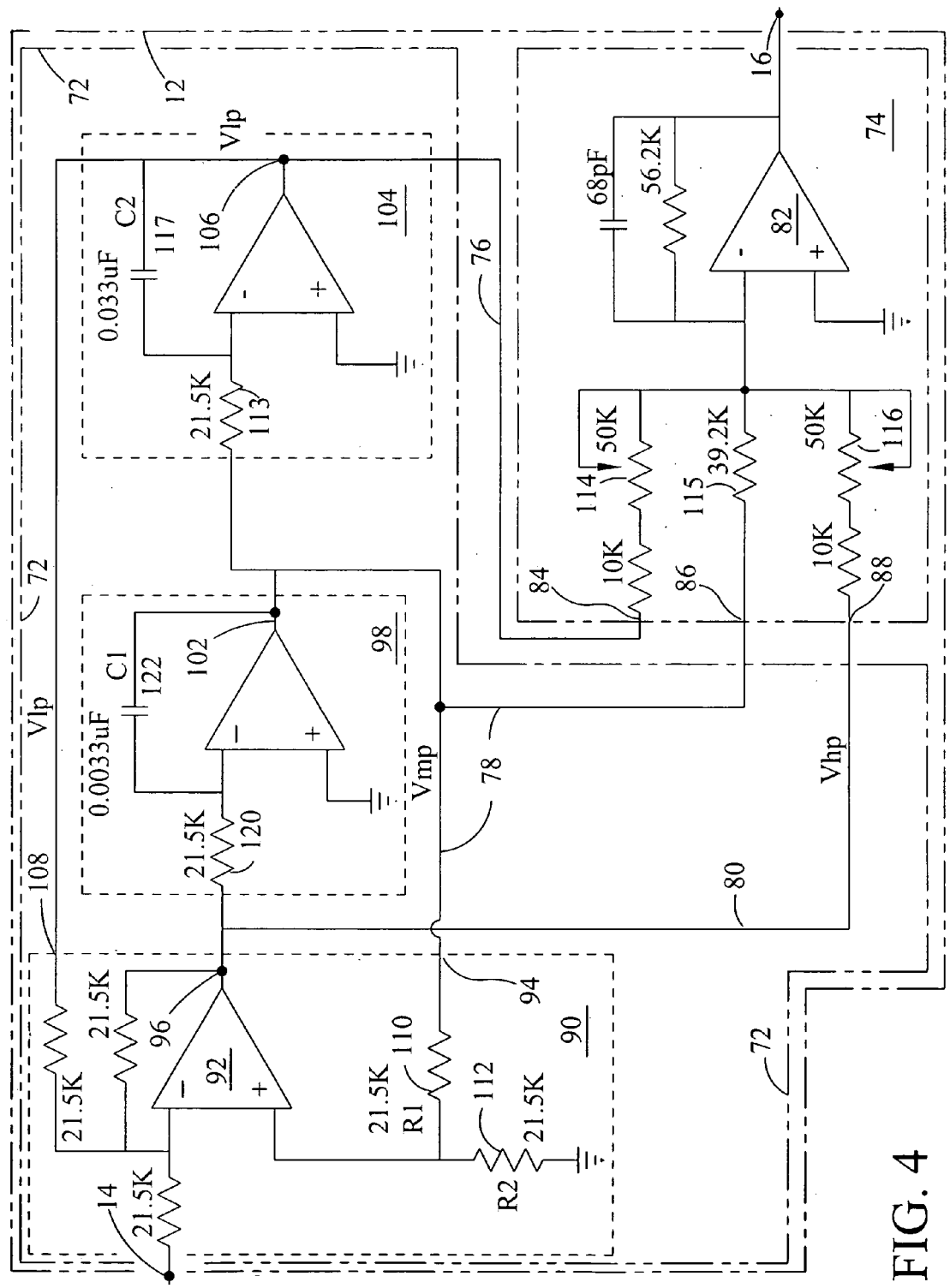
FIG. 4 is a schematic of the expanded block diagram of the second embodiment of the input buffer.

In FIG. 4, the input buffer 12 has gain control circuitry within the state-variable summing amplifier 74, such as adjustable resistors 114, 115 and 116, for balancing and summing the high, low and mid-range frequency compensated signals.

The state-variable filter within phantom box 72 is coupled or connected to the program input signal at terminal 14 and processes the program input signal into high, Vhp, low, Vlp and mid-range, Vmp frequency compensated signal components. The state-variable summing circuit 74 adds the high frequency compensated signal, the low frequency compensated signal and the mid-range frequency compensated signal to provide the buffered program signal at terminal 16. Adjustable resistors 114 and 116 represent an adjusting means within the state-variable summing amplifier 74 for adjusting the gain between the high and low frequency compensated signals and the mid-range signal.

The mid-range frequency compensated signal, Vmp produced by the state-variable filter 72 is inverted in phase with respect to the phase of the high and low frequency compensated signal components produced by the state-variable filter 72.

FIG. 4 shows that the state-variable summing amplifier 74 uses operational amplifier 82 and sums the respective Vlp, Vmp and Vhp signals at the low pass input 84, the mid-range input 86 and the high pass input 88, and provides the buffered program signal at output terminal 16 to the all pass phase inverter 18 and to the band pass filter 22 as shown in FIG. 1, or via switch 34, directly to power amplifier 30 to drive speaker 38.

As explained in U.S. Pat. No. 5,736,897 for a Low Input Signal Bandwidth Compressor & Amplifier Control Circuit with a State-variable Pre-Amplifier issued on Apr. 7, 1998, the combination of the state-variable filter 72 and the state-variable summing amplifier 74 form a functional and lower cost equivalent of the alternative embodiment three channel pre-amplifier shown in FIGS. 1 and 2 in the '897' patent.

Referring again to FIGS. 3 and 4, phantom block 90 represents an input summing and damping amplifier circuit. The program input signal at terminal 12 and the low range frequency compensated signal Vlp on signal line 76 are fed to the inverting input of amplifier 92. A portion of the mid-range frequency compensated signal Vmp is fed to the non-inverting input of amplifier 92 for damping via the damping input 94. The output of amplifier 92 is the high frequency compensated signal Vhp at amplifier output 96 which is connected to signal line 80.

The high frequency compensated signal Vhp is also connected to the negative input of a first integrator shown within phantom block, for inversion and integration and to the state-variable summing amplifier 74 high pass input 100 on signal line 80.

The first integrator 98 integrates the Vhp signal to provide the mid-range frequency compensated signal Vmp at first integrator output 102. The mid-range frequency compensated signal Vmp is fed to the damping input 94 of the input summing and damping amplifier circuit 90 and to the state-variable summing amplifier 92 mid-range frequency compensated signal input 86 on signal line 78.

Phantom block 104 represents a second integrator that responds to the mid-range frequency compensated signal Vmp on signal line 78 and provides a low Band-pass signal Vlp at the second integrator output terminal 106 to the state-variable summing amplifier 74 low range frequency compensated signal input 84 via signal line 76. The low frequency compensated signal Vlp is also fed to a second input 108 of the input summing and damping amplifier circuit 90.

The damping circuit of the input summing and damping amplifier circuit 90 comprises an input resistor 110 that has a first terminal connected to receive the mid-range frequency compensated signal, Vmp, at damping input 94. The second terminal of resistor 110 is coupled to the first terminal of resistor 112 and to the non-inverting input of operational amplifier 92. The second terminal of resistor 112 is coupled to a reference potential such as ground. The ratio of resistors 110 and 112 establish the "Q" of the state-variable filter. The higher the ratio of the resistors 110 and 112, the higher the Q. The Q of the state-variable filter of FIGS. 3 and 4 is typically in the range of 0.5 to 2 for audio applications. The Q of the circuit of FIG. 4 is approximately 0.67.

One of the objectives of the state-variable filter 72 is to set phase shift and gains up such that the mid-range frequency compensated signals are about 180 degrees out of phase with the signal components in the lower frequency band and in the higher frequency band. The ratio of the damping resistors, the gains and break frequencies of the amplifiers and integrator are set for a desired Q and Band-pass.

The state variable summing amplifier 74 has a low frequency band-pass gain adjustment pot 114, and a high range band-pass frequency gain adjustment pot 116 that permit the user to make a final adjustment for a particular circuit and component configuration. The adjustable inputs to the state variable summing amplifier 74 permit the user to obtain additional gain control of the Vhp and Vlp signals.

The state variable input buffer circuit of FIGS. 3 and 4 can be adjusted to obtain a total of 360 degrees of phase shift of the high frequency signal components of the input program signal with respect to the low frequency signal components of the input program signal, in frequency space over the range of 0–20,000 Hz. The high frequency components gain 360 degrees with respect to the lows.

The state variable pre-amplifier also provides a time delay that is adjusted to obtain about 2.5 ms time delay at 20 Hz. The 20 Hz components are physically delayed in real time by up to 2.5 ms with respect to the High Frequency components. The design objectives for audio applications are taught in U.S. Pat. No. 4,638,258 issued on Jan. 20, 1987 for a Reference Load Amplifier Correction System, to Robert C. Crooks. The contents of U.S. Pat. No. 4,638,258 are incorporated herein by reference in its entirety.

Referring again to FIG. 4, a reactance chart check will show that the break frequency for the mid-range Band-pass amplifier 98 is about 2.24 KHz. The break frequency for the low range Band-pass amplifier 104 is about a decade lower at 224 Hz at three dB per octave. The Q of the circuit of FIG. 4 is approximated by the following equation:

$$Q=(R1+R2)/3R2=0.67$$

where R1 is resistor 110 and R2 is resistor 112.

Viewing the circuit heuristically, the higher reactance of the smaller cap for mid-range bandpass amplifier 98 clearly sets the gain of the amplifier to higher values at lower frequencies than that of the low range band-pass amplifier 104. It can also be seen that the mid-range band-pass amplifier is a single pole filter. The feed back signal Vmp to the damping resistors results in a controlled Q in the mid-range frequencies band.

The design of the state variable filter of FIG. 4 is taught in the text "The Active Filter Handbook" by Frank P. Tedeschi, pg 178–182, Tab Books Inc of Blue Ridge Summit, Pa., 17214; however, this reference does not show the outputs being summed to form the desired unbalanced output that meets the desired requirement for audio applications.

The object of the design of FIG. 4 is to have a first break frequency at approximately 240 Hz and a second at 2.24 KHz, about a decade away from the first break. The low break fc is established by the equation:

$$fc=1/2\pi RC2$$

where R and C are the value of resistor 113 and capacitor 117. The high frequency break is set by the $$fc=1/2\pi RC1$$

where the value of R and C1 are those of resistor 120 and capacitor 122.

Once the Q is selected, the ratio of R1 to R2 can be calculated from the equation. In the case of FIG. 4, a Q of 0.67 was selected by knowing what the desired gain bandwidth response curve would be from the above referenced. U.S. Pat. No. 4,638,258. The circuit was modeled using a computer aided analysis program such as SPICE. The break frequencies were estimated from the information in the referenced U.S. Pat. No. 4,638,258. Initial component values were selected based on available components. A reactance chart can be used for a quick approximation of the required remaining value once one of the values are known. The circuit shown had a goal of a design center frequency at 700 Hz. At the center frequency, the gain of the circuit is about −1 dB or less than 1. The two adjustment pots, 114 and 116 permit an adjustment of the gain of the Vlp and the Vhp by about 15 dB with the values shown.

The Q is adjusted using the pots 114 and 116 to provide a best match to the curves in the earlier patent to Crook. The Q and the break points were selected to match the response characteristic of the resulting circuit to the curves in the earlier patent to yield the same phase shifts, time delays and frequency response. Resistors 114 and 116 are set for a gain of nine but a slightly higher gain of 12 is preferred.

The outputs Vhp, Vmp and Vlp of the state variable filer represent three independent state variables. Summing the three unbalanced outputs to obtain a buffered program signal is believed to be a novel step when combined with processing by the all pass inverter 18 in combination with the band pass filter 22 and with the resulting signals being summed by summing amplifier 26.

The procedure for adjusting the band-pass and gain as proposed in the above referenced text "The Active Filter Handbook" by Frank P. Tedeschi, at pages 178–182" is to set the value of C1 and C2 to be equal and to adjust the ratio of R1 and R2 and to obtain the desired Q. In state-variable summing amplifier 74, the gain controls for the Vhp and Vlp signals provide for independent control of the gain and band-pass.

The above-described embodiments are furnished as illustrative of the principles of the invention, and are not intended to define the only embodiment possible in accordance with our teaching. Rather, the invention is to be considered as encompassing not only the specific embodiments shown, but also any others falling within the scope of the following claims.

I claim:

1. An audio boost circuit comprising:
   an input buffer coupled to be responsive to a program input signal having high, low and mid-range frequency signal components, the input buffer having a state-variable filter for processing the program input signal into high, low and mid-range frequency signal components, and a state-variable summing amplifier for balancing and summing the low range, high range and mid-range signal components and for providing a buffered program signal at an output thereof,
   an all pass phase inverter having an input coupled to receive the buffered program signal and an output providing an inverted buffered program signal,
   a Band-pass filter having a predetermined Q and an input directly connected to the output of the input buffer to receive the buffered program signal and to provide an inverted Band-pass boosted program signal,
   a summing amplifier for adding the inverted buffered program signal to the inverted Band-pass boosted program signal and for providing a composite output signal.

2. The audio boost circuit of claim 1 wherein the input buffer's state-variable filter for providing a compensated signal further comprises:
   a first amplifier stage responsive to the program signal for providing a high range frequency compensated signal;
   a second amplifier stage responsive to an output of the first amplifier stage for providing a mid-range frequency compensated signal;
   a third amplifier stage responsive to the mid range compensated signal for providing a low range frequency compensated signal; and
   a state-variable summing circuit for adding the high range frequency compensated signal, the low range frequency compensated signal and the mid-range frequency compensated signal to provide the buffered program signal.

3. The audio boost circuit of claim 2 wherein the mid-range frequency compensated signal is out of phase with the high range frequency compensated signal and low range frequency compensated signals.

4. The audio boost circuit of claim 3 wherein the input buffer's state-variable filter for providing a buffered program signal further comprises:
   an adjusting means for adjusting the gain between the high range frequency compensated signal and the mid-range frequency compensated signal.

5. An audio boost circuit comprising:
an input buffer responsive to a program input signal having high, low and mid-range frequency signal components for providing a buffered program signal at an output terminal, the input buffer comprising:
a state-variable filter for processing the input program signal into high range, low range and mid-range frequency compensated signal components, the state-variable filter comprising:
a first amplifier stage responsive to the program signal for providing a high range frequency compensated signal;
a second amplifier stage responsive to an output of the first amplifier stage for providing a mid-range frequency compensated signal; and,
a third amplifier stage responsive to an output of the second amplifier stage for providing a low range frequency compensated signal;
the input buffer further comprising:
a state-variable summing circuit for adding the high range frequency compensated signal, the low range frequency compensated signal and the mid-range frequency compensated signal and an adjusting means for adjusting the gain between the high range frequency compensated signal and the mid-range frequency compensated signal; and the low range frequency compensated signal to provide the buffered program signal at the output terminal;
an all pass phase inverter having an input coupled to receive the buffered program signal and an output providing an inverted buffered program signal,
a Band-pass filter having a predetermined Q, and an input directly connected to the output terminal of said input buffer for receiving the buffered program signal for providing an inverted Band-pass boosted program signal,
a summing amplifier for adding the inverted buffered program signal to the inverted Band-pass boosted program signal and for providing a composite program signal, and
a power amplifier and speaker means responsive to the composite program 5 signal for producing an audible sound in response to the composite program signal.

6. The audio boost circuit of claim 5 wherein the mid-range signal components are inverted in phase with respect to the high and Low range frequency signal components.

7. The audio boost circuit of claim 5 wherein the input buffer's state-variable filter further comprises:
a first amplifier stage having an inverting and non-inverting input; the program signal being coupled to the inverting input; and
a resistor divider network responsive to the mid-range compensated signal, the resistor divider network having an output for providing a portion of the mid-range frequency compensated signal to the first amplifier non-inverting input.

8. An audio boost circuit comprising:
input buffer means for receiving a program input signal and for processing the input program signal to provide high, low and mid-range frequency compensated signal components, the input buffer having gain control circuitry for balancing and summing the high and mid-range frequency compensated signals to provide a buffered program signal at an output terminal,
an all pass phase inverter having an input coupled to receive the buffered program signal and an output providing an inverted buffered program signal,
a Band-pass filter having a predetermined Q, and an input directly connected to the output terminal of the input buffer for receiving the buffered program signal for providing an inverted Band-pass boosted program signal,
a summing amplifier for adding the inverted buffered program signal to the inverted Band-pass boosted program signal and for providing a composite program signal.

9. The audio boost circuit of claim 8 wherein the Band-pass filter having a predetermined Q has a peak gain at a center frequency, and,
frequency adjustment means for adjusting the frequency at which the peak gain occurs.

10. The audio boost circuit of claim 9 wherein the Band-pass filter frequency adjustment means for adjusting the frequency at which the peak gain occurs comprises:
a frequency adjustment resistor interposed in series with the second resistor and the reference potential.

11. The audio boost circuit of claim 10 wherein the Band-pass filter's first, second and third resistor values and the values of the first and second
capacitors are selected to obtain a Q in the range of from 3 to 6, and
the frequency adjustment resistor is adjusted to position the peak gain at a frequency in the range of 50 to 100 hertz.

12. The audio boost circuit of claim 8 wherein the Band-pass filter having a predetermined Q further comprises:
a first, second and third resistor, each having a first and second terminal,
a first and second capacitor, each capacitor having a first and second terminal, and
an operational amplifier having an inverting input, a non-inverting input and an output,
the first resistor first terminal being coupled to receive the buffered program signal, the first resistor second terminal being coupled to the second resistor first terminal and to the first terminal of the first and second capacitors, the second resistor's second terminal being coupled to a reference potential and to the operational amplifier's non-inverting input, the first capacitor second terminal being connected to the operational amplifier's inverting input and to the third resistor's first terminal, the second capacitor's second terminal being connected to the operational amplifier's output terminal and to the third resistor's second terminal.

13. The audio boost circuit of claim 8 wherein the summing amplifier for adding the inverted buffered program signal to the inverted Band-pass boosted program signal and for providing a composite program signal further comprises:
a first input coupled to receive the inverted buffered program signal and a second input coupled to receive the inverted Band-pass boosted program signal, and
adjustment means for adjusting the relative gain of the inverted buffered program signal with respect to the inverted Band-pass boosted program signal.

14. The audio boost circuit of claim 13 wherein the adjustment
means for adjusting the relative gain of the inverted buffered program signal with respect to the inverted Band-pass boosted program signal further comprises a boost adjusting resistor in series with the second input to the summing amplifier.

15. The audio boost circuit of claim 8 wherein the input buffer further comprises:
- a state-variable filter responsive to the program input signal for producing high, low and mid-range frequency compensated signal components; and
- a state-variable summing amplifier for adding the high, low and mid-range frequency compensated signal components to provide the buffered program signal.

16. The audio boost circuit of claim 15 wherein the mid-range signal components produced by the state-variable filter are inverted in phase with respect to the phase of the high and low frequency compensated signal components produced by the state-variable filter.

* * * * *